(12) United States Patent
Brauer (10) Patent No.: US 10,620,135 B2
(45) Date of Patent: Apr. 14, 2020

(54) IDENTIFYING A SOURCE OF NUISANCE DEFECTS ON A WAFER

(71) Applicant: KLA-Tencor Corporation, Milpitas, CA (US)

(72) Inventor: Bjorn Brauer, Beaverton, OR (US)

(73) Assignee: KLA-Tencor Corp., Milpitas, CA (US)

( * ) Notice: Subject to any disclaimer, the term of this patent is extended or adjusted under 35 U.S.C. 154(b) by 186 days.

(21) Appl. No.: 15/947,730

(22) Filed: Apr. 6, 2018

(65) Prior Publication Data

US 2019/0025229 A1    Jan. 24, 2019

Related U.S. Application Data

(60) Provisional application No. 62/534,601, filed on Jul. 19, 2017.

(51) Int. Cl.
| | | |
|---|---|---|
| *G01N 21/95* | (2006.01) | |
| *G06T 7/00* | (2017.01) | |
| *G06F 17/50* | (2006.01) | |
| *G01N 21/956* | (2006.01) | |

(52) U.S. Cl.
CPC ..... *G01N 21/9503* (2013.01); *G01N 21/9501* (2013.01); *G06F 17/5081* (2013.01); *G06T 7/001* (2013.01); *G06T 7/0006* (2013.01); *G01N 21/95607* (2013.01); *G06T 2207/10061* (2013.01); *G06T 2207/30148* (2013.01)

(58) Field of Classification Search
None
See application file for complete search history.

(56) References Cited

U.S. PATENT DOCUMENTS

| | | |
|---|---|---|
| 7,570,796 B2 | 8/2009 | Zafar et al. |
| 7,676,077 B2 | 3/2010 | Kulkarni et al. |
| 8,126,255 B2 | 2/2012 | Bhaskar et al. |
| 8,611,639 B2 | 12/2013 | Kulkarni et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 8,948,494 B2 * | 2/2015 | Plihal ................. G06T 5/50 382/145 |

(Continued)

OTHER PUBLICATIONS

International Search Report for PCT/US2018/042944 dated Nov. 6, 2018.

*Primary Examiner* — Soo Jin Park
(74) *Attorney, Agent, or Firm* — Ann Marie Mewherter (57) ABSTRACT

Methods and systems for identifying a source of nuisance defects on a wafer are provided. One method includes detecting defects on a wafer by applying a hot threshold to output generated for the wafer by a detector of an inspection subsystem such that at least a majority of the detected defects include nuisance defects and determining locations of the detected defects with respect to design information for the wafer. In addition, the method includes stacking information for the detected defects based on the determined locations relative to a structure on the wafer such that the detected defects having the same locations relative to the structure are coincident with each other in results of the stacking. The method further includes identifying a source of the nuisance defects based on the results of the stacking.

19 Claims, 4 Drawing Sheets

(56) References Cited

U.S. PATENT DOCUMENTS

| | | | |
|---|---|---|---|
| 8,984,450 B2* | 3/2015 | Hu | G01N 21/9501 |
| | | | 716/52 |
| 9,129,237 B2* | 9/2015 | Leu | G06Q 10/06395 |
| 9,222,895 B2 | 12/2015 | Duffy et al. | |
| 9,310,316 B2* | 4/2016 | Wu | G01N 21/9501 |
| 2005/0004774 A1 | 1/2005 | Volk et al. | |
| 2009/0055783 A1 | 2/2009 | Florence et al. | |
| 2009/0287440 A1 | 11/2009 | Kulkarni et al. | |
| 2013/0173041 A1* | 7/2013 | Leu | G06Q 10/06 |
| | | | 700/105 |
| 2014/0133737 A1* | 5/2014 | Plihal | G06T 7/0004 |
| | | | 382/149 |
| 2016/0292840 A1 | 10/2016 | Konecky et al. | |
| 2016/0372303 A1 | 12/2016 | Park et al. | |
| 2017/0047195 A1 | 2/2017 | Lee et al. | |

\* cited by examiner

IDENTIFYING A SOURCE OF NUISANCE DEFECTS ON A WAFER

BACKGROUND OF THE INVENTION

1. Field of the Invention

This invention generally relates to methods and systems for identifying a source of nuisance defects on a wafer.

2. Description of the Related Art

The following description and examples are not admitted to be prior art by virtue of their inclusion in this section.

An integrated circuit (IC) design may be developed using a method or system such as electronic design automation (EDA), computer aided design (CAD), and other IC design software. Such methods and systems may be used to generate the circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive.

Relatively high nuisance rates are a common problem and prevent running hot enough (i.e., into the noise floor) to find substantially small defects. Identifying how the nuisance defects got introduced is often key to find the right nuisance suppression technique. Scanning electron microscope (SEM) images may be used to correlate optical images to SEM images to find out where the nuisance defects came from, but this is a long and time consuming process. In addition, very often, the nuisance defects are not visible in the SEM images, which makes it impossible to predict in which layer and patterned feature they got introduced. As an alternative, transmission electron microscope (TEM) cross-sectioning of the nuisance defects can be performed, but this is a substantially time consuming technique, and the location of the nuisance defects is substantially hard to find.

Accordingly, it would be advantageous to develop systems and/or methods for identifying a source of nuisance defects on a wafer that do not have one or more of the disadvantages described above.

SUMMARY OF THE INVENTION

The following description of various embodiments is not to be construed in any way as limiting the subject matter of the appended claims.

One embodiment relates to a system configured to identify a source of nuisance defects on a wafer. The system includes an inspection subsystem that includes at least an energy source and a detector. The energy source is configured to generate energy that is directed to a wafer. The detector is configured to detect energy from the wafer and to generate output responsive to the detected energy. The system also includes one or more computer subsystems configured for detecting defects on the wafer by applying a hot threshold to the output such that at least a majority of the detected defects include nuisance defects. The one or more computer subsystems are also configured for determining locations of the detected defects with respect to design information for the wafer. In addition, the one or more computer subsystems are configured for stacking information for the detected defects based on the determined locations relative to a structure on the wafer such that the detected defects having the same locations relative to the structure are coincident with each other in results of the stacking. The one or more computer subsystems are further configured for identifying a source of the nuisance defects based on the results of the stacking. The system may be further configured as described herein.

Another embodiment relates to a computer-implemented method for identifying a source of nuisance defects on a wafer. The method includes detecting defects on the wafer by applying a hot threshold to output generated for the wafer by a detector of an inspection subsystem such that at least a majority of the detected defects include nuisance defects. The inspection subsystem is configured as described above. The method also includes determining locations of the detected defects with respect to design information for the wafer. In addition, the method includes stacking information for the detected defects based on the determined locations relative to a structure on the wafer such that the detected defects having the same locations relative to the structure are coincident with each other in results of the stacking. The method further includes identifying a source of the nuisance defects based on the results of the stacking. The detecting, determining, stacking, and identifying steps are performed by one or more computer subsystems coupled to the inspection subsystem.

Each of the steps of the method described above may be further performed as described further herein. In addition, the method described above may include any other step(s) of any other method(s) described herein. Furthermore, the method described above may be performed by any of the systems described herein.

An additional embodiment relates to a non-transitory computer-readable medium storing program instructions executable on a computer system for performing a computer-implemented method for identifying a source of nuisance defects on a wafer. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used herein generally refer to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In general, however, the design information or data cannot be generated by imaging a wafer with a wafer inspection system. For example, the design patterns formed on the wafer may not accurately represent the design for the wafer and the wafer inspection system may not be capable of generating images of the design patterns formed on the wafer with sufficient resolution such that the images could be used to determine information about the design for the wafer. Therefore, in general, the design information or design data cannot be generated using a physical wafer. In addition, the "design" and "design data" described herein refers to information and data that is generated by a semiconductor device designer in a design process and is therefore available for use in the embodiments described herein well in advance of printing of the design on any physical wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

Figure 1:
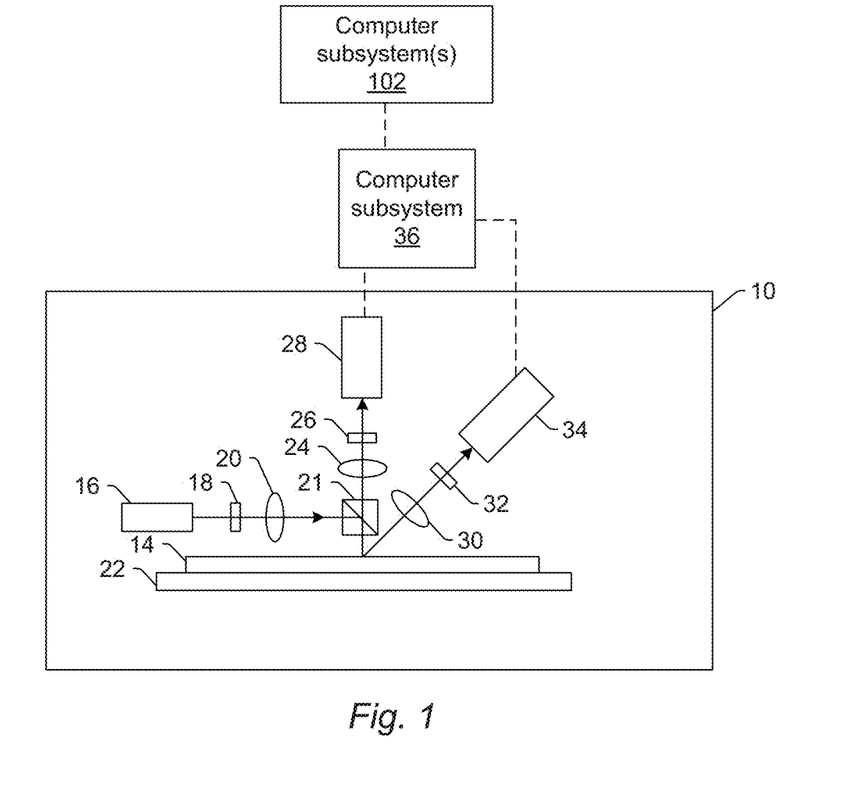
FIG. 1 is a schematic diagram illustrating a side view of an embodiment of a system configured as described herein.

One embodiment relates to a system configured to identify a source of nuisance defects on a wafer. One embodiment of such a system is shown in FIG. 1. The system includes an inspection subsystem that includes at least an energy source and a detector. The energy source is configured to generate energy that is directed to a wafer. The detector is configured to detect energy from the wafer and to generate output responsive to the detected energy. The wafer may include any wafer known in the art.

In one embodiment, the inspection subsystem is configured as an optical inspection subsystem. For example, in the embodiment of the system shown in FIG. 1, inspection subsystem 10 includes an illumination subsystem configured to direct light to wafer 14. The illumination subsystem includes at least one light source. For example, as shown in FIG. 1, the illumination subsystem includes light source 16. In one embodiment, the illumination subsystem is configured to direct the light to the wafer at one or more angles of incidence, which may include one or more oblique angles and/or one or more normal angles. For example, as shown in FIG. 1, light from light source 16 is directed through optical element 18 and then lens 20 to beam splitter 21, which directs the light to wafer 14 at a normal angle of incidence. The angle of incidence may include any suitable angle of incidence, which may vary depending on, for instance, characteristics of the wafer and the defects to be detected on the wafer.

The illumination subsystem may be configured to direct the light to the wafer at different angles of incidence at different times. For example, the inspection subsystem may be configured to alter one or more characteristics of one or more elements of the illumination subsystem such that the light can be directed to the wafer at an angle of incidence that is different than that shown in FIG. 1. In one such example, the inspection subsystem may be configured to move light source 16, optical element 18, and lens 20 such that the light is directed to the wafer at a different angle of incidence.

In some instances, the inspection subsystem may be configured to direct light to the wafer at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the wafer at the same time as the other light, one or more characteristics (e.g., wavelength, polarization, etc.) of the light directed to the wafer at different angles of incidence may be different such that light resulting from illumination of the wafer at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the wafer. Multiple illumination channels may be configured to direct light to the wafer at the same time or at different times (e.g., when different illumination channels are used to sequentially illuminate the wafer). In another instance, the same illumination channel may be configured to direct light to the wafer with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the wafer at different times. The illumination subsystem may have any other suitable configuration known in the art for directing light having different or the same characteristics to the wafer at different or the same angles of incidence sequentially or simultaneously.

In one embodiment, light source 16 may include a broadband plasma (BBP) light source. In this manner, the light generated by the light source and directed to the wafer may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the wafer. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for inspection.

The inspection subsystem may also include a scanning subsystem configured to cause the light to be scanned over the wafer. For example, the inspection subsystem may include stage 22 on which wafer 14 is disposed during inspection. The scanning subsystem may include any suitable mechanical and/or robotic assembly (that includes stage 22) that can be configured to move the wafer such that the light can be scanned over the wafer. In addition, or alternatively, the inspection subsystem may be configured such that one or more optical elements of the inspection subsystem perform some scanning of the light over the wafer. The light may be scanned over the wafer in any suitable fashion.

The inspection subsystem further includes one or more detection channels. At least one of the one or more detection channels includes a detector configured to detect light from the wafer due to illumination of the wafer by the inspection subsystem and to generate output responsive to the detected light. For example, the inspection subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the wafer. However, two or more of the detection channels may be configured to detect the same type of light from the wafer (e.g., specularly reflected light). Although FIG. 1 shows an embodiment of the inspection subsystem that includes two detection channels, the inspection subsystem may include a different number of detection channels (e.g., only one detection channel or two or more detection channels). Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the inspection subsystem may be signals or data, but not image signals or image data. In such instances, a computer subsystem such as computer subsystem 36 of the system may be configured to generate images of the wafer from the non-imaging output of the detectors. However, in other instances, the detectors may be configured as imaging detectors that are configured to generate imaging signals or image data. Therefore, the system may be configured to generate the output described herein in a number of ways.

It is noted that FIG. 1 is provided herein to generally illustrate a configuration of an inspection subsystem that may be included in the system embodiments described herein. Obviously, the inspection subsystem configuration described herein may be altered to optimize the performance of the system as is normally performed when designing a commercial inspection system. In addition, the systems described herein may be implemented using an existing inspection system (e.g., by adding functionality described herein to an existing inspection system) such as the 28xx and 29xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Computer subsystem 36 of the system may be coupled to the detectors of the inspection subsystem in any suitable manner (e.g., via one or more transmission media, which may include "wired" and/or "wireless" transmission media) such that the computer subsystem can receive the output generated by the detectors during scanning of the wafer. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

As described further herein, some embodiments may include performing defect review for a selected portion of defects detected on a wafer. The defect review may be performed using a defect review tool, which may be configured as an electron beam based tool that may or may not be included in the system embodiments described herein. For example, the one or more computer subsystems described herein may be coupled to a defect review tool such that the computer subsystem(s) can acquire defect review results (e.g., defect review images) by causing the defect review tool to scan the locations of the selected portion of the detected defects on the wafer. However, the system embodiments described herein may include an electron beam based tool or subsystem that can be used to generate defect review output for the defects that can then be used to classify the defects (e.g., as nuisance defects or other defects). In one such embodiment shown in FIG. 2, the electron beam based subsystem includes electron column 122, which is coupled to computer subsystem 124.

Figure 2:
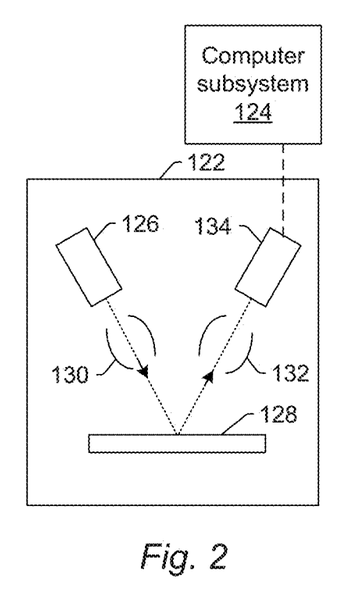
FIG. 2 is a schematic diagram illustrating a side view of an embodiment of an electron beam based tool configured as described herein.

As also shown in FIG. 2, the electron column includes electron beam source 126 configured to generate electrons that are focused to wafer 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the wafer (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the wafer at an oblique angle of incidence and are scattered from the wafer at another oblique angle, it is to be understood that the electron beam may be directed to and scattered from the wafer at any suitable angles. In addition, the electron beam based tool may be configured to use multiple modes to generate images of the wafer (e.g., with different illumination angles, collection angles, etc.). The multiple modes of the electron beam based tool may be different in any image generation parameters of the tool.

Computer subsystem 124 may be coupled to detector 134 as described above. The detector may detect electrons returned from the surface of the wafer thereby forming electron beam images of the wafer. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the electron beam based subsystem shown in FIG. 2 may be further configured as described herein.

It is noted that FIG. 2 is provided herein to generally illustrate a configuration of an electron beam based tool that may be included in the embodiments described herein. As with the optical inspection subsystem described above, the electron beam based tool configuration described herein may be altered to optimize the performance of the electron beam based tool as is normally performed when designing a commercial defect review system. In addition, the systems described herein may be implemented using an existing defect review system (e.g., by adding functionality described herein to an existing defect review system) such as the eDR-xxxx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Although the defect review tool is described above as being an electron beam review tool, the defect review tool may be an ion beam defect review tool. Such a defect review tool may be configured as shown in FIG. 2 except that the electron beam source may be replaced with any suitable ion beam source known in the art. In addition, the defect review tool may be any other suitable ion beam tool such as those included in commercially available focused ion beam (FIB) systems, helium ion microscopy (HIM) systems, and secondary ion mass spectroscopy (SIMS) systems.

As noted above, the inspection and defect review subsystems may be configured for directing energy (e.g., light, electrons) to and/or scanning energy over a physical version of the wafer thereby generating actual (i.e., not simulated) output and/or images for the physical version of the wafer. In this manner, the inspection and defect review subsystems may be configured as "actual" tools, rather than "virtual" tools. Computer subsystem(s) 102 shown in FIG. 1 may, however, include one or more "virtual" systems (not shown) that are configured for performing one or more functions using at least some of the actual optical images and/or the actual electron beam images generated for the wafer, which may include any of the one or more functions described further herein.

The one or more virtual systems are not capable of having the wafer disposed therein. In particular, the virtual system(s) are not part of inspection subsystem 10 or the defect review subsystem and do not have any capability for handling the physical version of the wafer. In other words, in a system configured as a virtual system, the output of its one or more "detectors" may be output that was previously generated by one or more detectors of an actual inspection subsystem and that is stored in the virtual system, and during the "imaging and/or scanning," the virtual system may replay the stored output as though the wafer is being imaged and/or scanned. In this manner, imaging and/or scanning the wafer with a virtual system may appear to be the same as though a physical wafer is being imaged and/or scanned with an actual system, while, in reality, the "imaging and/or scanning" involves simply replaying output for the wafer in the same manner as the wafer may be imaged and/or scanned.

Systems and methods configured as "virtual" inspection systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents.

The inspection and defect review subsystems described herein may be configured to generate output for the wafer with multiple modes or "different modalities." In general, a "mode" or "modality" (as those terms are used interchangeably herein) of an inspection or defect review subsystem can be defined by the values of parameters of the inspection or defect review subsystem used for generating output and/or images for a wafer. Therefore, modes that are different may be different in the values for at least one of the parameters of the inspection or defect review subsystem. In this manner, in some embodiments, the output includes images generated by the inspection subsystem with two or more different values of a parameter of the inspection subsystem. For example, in one embodiment of an inspection subsystem, at least one of the multiple modes uses at least one wavelength of the light for illumination that is different from at least one wavelength of the light for illumination used for at least one other of the multiple modes. The modes may be different in the illumination wavelength as described further herein (e.g., by using different light sources, different spectral filters, etc.) for different modes. In another embodiment, at least one of the multiple modes uses an illumination channel of the inspection subsystem that is different from an illumination channel of the inspection subsystem used for at least one other of the multiple modes. For example, as noted above, the inspection subsystem may include more than one illumination channel. As such, different illumination channels may be used for different modes.

In a similar manner, the electron beam images may include images generated by the defect review subsystem with two or more different values of a parameter of the defect review subsystem. For example, the defect review subsystem may be configured to generate output for the wafer with multiple modes or "different modalities." The multiple modes or different modalities of the defect review subsystem can be defined by the values of parameters of the defect review subsystem used for generating output and/or images for a wafer. Therefore, modes that are different may be different in the values for at least one of the electron beam parameters of the defect review subsystem. For example, in one embodiment of an electron beam defect review subsystem, at least one of the multiple modes uses at least one angle of incidence for illumination that is different from at least one angle of incidence of the illumination used for at least one other of the multiple modes.

The computer subsystem(s) are configured for detecting defects on the wafer by applying a hot threshold to the output such that at least a majority of the detected defects include nuisance defects. "Nuisance defects" as that term is used herein is generally defined as defects that are detected on the wafer as such but are not really actual defects on the wafer. Instead, "nuisance defects" may be detected due to non-defect noise sources on the wafer (e.g., line edge roughness, relatively small critical dimension (CD) variation in patterned features, thickness variations, etc.) and/or due to marginalities in the inspection subsystem itself or its configuration used for inspection.

Generally, therefore, the goal of inspection is not to detect nuisance defects on wafers. However, in the embodiments described herein, the computer subsystem(s) may run a hot scan (i.e., a scan in which output is generated for the wafer as light is scanned across it and a hot threshold is applied to the output thereby rendering it a "hot scan") to generate a significant number of nuisance defect examples for statistically meaningful results. In particular, by running a hot scan, statistically sufficient data can be generated for other steps described herein. In other words, because it is a hot scan, a significant number of nuisance defects will be detected and at least some defects of interest (DOIs) will also be detected (because they will also be detected by a hot scan). Regardless of the number of DOIs that are detected, the significant number of nuisance defects that are detected provide statistically sufficient data for other steps described herein. In this manner, "at least a majority of the detected defects" that include nuisance defects may be closer to 100% than to 50% of the defects. In one such example, more than 90% of the defects detected by applying the hot threshold to the output may be nuisance defects.

Detecting defects on the wafer may be performed in any suitable manner known in the art (e.g., applying a hot threshold to the output and determining that any output having a value above the hot threshold corresponds to a defect or a potential defect) with any suitable defect detection method and/or algorithm. A "hot" threshold can be generally defined as a threshold that is at, within, or substantially near the noise floor of the output generated by the inspection subsystem for the wafer. In this manner, the defect detection can be quite a bit more aggressive (hotter) than would normally be performed for a tuned inspection recipe, so that more events, including defects and nuisance events, are detected than desired in a tuned inspection. In this manner, such an inspection would not normally be useful for production monitoring due to the substantially high nuisance defect detection. Such an inspection is commonly referred to as a "hot" inspection.

The method also includes determining locations of the detected defects with respect to design information for the wafer. As described further herein, the locations of the detected defects may be determined in a number of different ways. In one embodiment, the locations of the detected defects are determined with sub-pixel accuracy. "Sub-pixel" as that term is used herein is generally defined as smaller than a pixel of output generated by an inspection subsystem. In this manner, "sub-pixel accuracy" as that term is used herein can be generally defined as the determination of something (e.g. a defect location) with an error smaller than the size (distance from one side to the other) of a single pixel in the image acquired by the inspection subsystem. The defect location determinations described further herein enable the defect locations to be determined with sub-pixel accuracy. For example, an interpolation of the point spread function of a defect can be performed as described further herein to thereby determine the defect location with sub-pixel accuracy.

In some embodiments, the locations of the detected defects are determined by interpolation of the defect locations within the output and alignment of the output to the design information for the wafer. For example, interpolating the location of each defect as good as possible may be performed using the latest align to design methods and systems that are commercially available from KLA-Tencor and defect location interpolation techniques. In addition, layer information in the design information for the wafer may be used to align the design substantially accurately to the optical patch images generated by the inspection subsystem. Once the design is aligned to the optical images, the defect coordinates extracted from the optical patch images are overlaid with the design. In this manner, highly accurate coordinates for the defects in design space (i.e., "design coordinates") can be determined and can then be correlated to layer structures as described further herein.

Interpolation may be performed to upsample the output corresponding to the defects (e.g., a portion of a difference image, which may be generated as described herein) onto a grid of pixels that is finer than a grid of pixels in the output and using a location of a center of a pixel in the finer grid of pixels with the strongest signal as the location of the defect. These steps may be performed in any suitable manner known in the art. The interpolation may also be performed in any other suitable manner known in the art.

Aligning the output (e.g., images) to the design information may be performed in a number of different manners. For example, in some embodiments, the aligning includes maximizing a cross-correlation between the output and the design information. In one such example, upon inspection, the measured images may be aligned to the design information by maximizing the cross-correlation between the images and the design information. The cross-correlation that is used in the aligning may include any suitable cross-correlation known in the art such as a normalized cross-correlation. Aligning the output for the detected defects to the design information for the wafer may also be performed as described in the above-incorporated patent to Kulkarni. The embodiments described herein may be configured to perform any of the aligning described in this patent.

In another embodiment, detecting the defects includes generating difference images for different portions of the output by subtracting reference output for the different portions from the different portions of the output and applying the hot threshold to the difference images, and determining the locations of the detected defects is performed by fitting a portion of the difference images corresponding to the detected defects to a function. The reference output may be acquired in any suitable manner. In one example, the reference output may be output generated for a corresponding location on the wafer. In a particular example, the different portions of the output may include output generated for different areas in a die on the wafer, and the reference output may include output generated for corresponding areas in a different die on the wafer. Generating the difference images may include aligning the reference output and corresponding portions of the output and then subtracting the reference output from the corresponding portions of the output, which may be performed in any suitable manner. The hot threshold may be applied to the difference images as described further herein.

The function to which the portion of the difference images is fit may be one of several possible functions. In general, a parabolic fit of the point spread function of the defects may be used to interpolate the defect locations. One could also use higher order polynomials, but they are computationally more expensive. For example, the function may be a Gaussian function. In such an example, the measured signal in the difference image corresponding to a detected defect can be fitted to the expected signal profile (e.g., a Gaussian profile) for the detected defect. In other words, the computer subsystem(s) may fit for the defect location using a Gaussian model. For some modes of the inspection subsystem and for defects with irregular signal profiles, the defect locations could be determined by fitting to simulations of these signal profiles. In another example, determining the locations of the detected defects is performed by fitting a portion of the difference images corresponding to the defects to an Airy disc function. For example, functions that can be used to describe the defect profiles may include functions that can be described analytically (e.g., Airy discs or polynomials) or functions derived from measurements (e.g., a set of defects are measured and their profiles are averaged together). The model or function used for the expected signal profiles of the inspection subsystem may include any suitable such model or function known in the art having any suitable format known in the art. In addition, the fitting of the portion of the difference image to the model for the signal profiles may be performed in any suitable manner.

The computer subsystem(s) are also configured for stacking information for the detected defects based on the determined locations relative to a structure on the wafer such that the detected defects having the same locations relative to the structure are coincident with each other in results of the stacking. Stacking the information may include projecting all defect locations into one single die (die stack), printed reticle instance on the wafer (reticle stack), or design patterned features (design stack). For example, in one embodiment, the structure on the wafer includes a die on the wafer. In another embodiment, the structure on the wafer includes a printed instance of a reticle on the wafer. In a further embodiment, the structure on the wafer includes patterned features formed on the wafer.

In one such example, as described further herein, the defect locations are determined with respect to design information on the wafer. Those defect locations can then be used to determine the defect locations relative to the structure on the wafer (i.e., the die, the printed instance of the reticle, or particular patterned features on the wafer). Then, those defect locations relative to the structure may be used to stack the defects with respect to a single structure on the wafer (e.g., a single die, printed reticle instance, patterned feature or set of patterned features, etc.). In one such example, "stacking" may include generating a plot or schematic illustrating all of the detected defects within an area of a die at their determined within die locations (i.e., the die relative locations or locations determined with respect to an origin of the die). In this manner, the defect detection results are "stacked" in that the defect detection results for multiple corresponding areas on a wafer (e.g., multiple dies) are overlaid with one another into a single instance of the area.

The results of the stacking may also be a design based stack by projecting nuisance defects onto certain design structures. In this manner, the defect locations can be overlaid with one another into a single instance of a particular area on the wafer as well as any design information corresponding to that particular area. The right design information for any particular defect detection results may be determined by comparing the optical images generated for the defects to different design layer images to thereby identify one or more of the design layers that have at least some potential spatial correspondence with the defect spatial distribution. Those design layer images can then be combined in a stack that matches the optical images best. In addition, the design layer information that is used to create a design stack may include a stack of design files including all of the patterning layers formed on the wafer before the layer where the defect inspection takes place (i.e., the last layer formed on the wafer prior to inspection).

Figure 3:
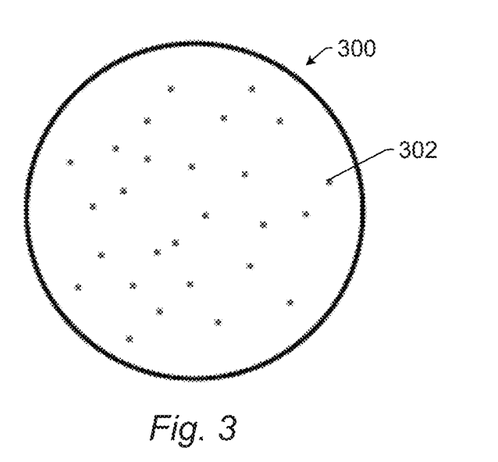
FIG. 3 is a schematic diagram illustrating an example of a wafer map illustrating defect detection results that may be generated by the embodiments described herein.

In one embodiment, after the defect locations have been determined as described herein, they may be presented in some manner such as a wafer map. FIG. 3 illustrates one example of such a wafer map. In particular, wafer map 300 shows a schematic outline of a wafer and locations 302 of defects determined as described herein. Therefore, the wafer map shows the defect locations with respect to the wafer. As described herein, the defect locations may be determined as defect locations relative to design information for a wafer. Those defect locations along with information for how the design information is printed on the wafer may be used to determine the defect locations relative to the wafer. Wafer map 300 is not shown herein to illustrate any particular defect locations determined for any particular wafer. Instead, wafer map 300 is included herein simply to further understanding of the embodiments described herein. In addition, the defect locations relative to the design information for the wafer and/or the wafer itself may be stored or presented in any other suitable manner known in the art. That information may then be used to calculate one of the various stacks described herein (e.g., a die stack, a reticle stack, or a design stack).

In some embodiments, the one or more computer subsystems are configured for identifying the detected defects that are the nuisance defects by identifying areas in the stacking results in which a number of the detected defects located therein per unit area is greater than a predetermined threshold and designating the detected defects located in the identified areas as the nuisance defects. For example, since the defects are detected as described herein using a hot threshold, many more of the detected defects will be nuisance defects compared to non-nuisance defects (e.g., actual defects and DOIs). In addition, the nuisance defects will most likely be detected across all of the inspected area of the wafer but in higher numbers in, on, or near patterned features or areas that cause the nuisance defects. Therefore, the detected defects that are most likely nuisance defects may be identified by finding areas in the stacking results in which the defect density is particularly high (e.g., higher than some preset threshold, an appropriate value for which may be set by a user). Most of the defects detected in those areas can then be designated as nuisance defects for the purposes described herein. Whether or not the identified nuisance defects are actually nuisance defects versus actual defects and/or DOI may be determined as described further herein.

The computer subsystem(s) are further configured for identifying a source of the nuisance defects based on the results of the stacking. In addition, as described above, determining the locations of the defects may include design based alignment. Therefore, the embodiments described herein may be configured for nuisance defect source analysis using design based alignment. The embodiments described herein may also be configured for identifying the source (e.g., layer, patterned features, etc.) where nuisance and/or defects are introduced. For example, based on the stack containing nuisance defect examples, the design layer in which the nuisance defects are located may be investigated to find out at which step in the process they got most likely introduced and what are the nuisance structures (i.e., the patterned features that cause the nuisance defects). In another example, based on the defect location distribution within the stack, the layer in which the defects got introduced can be identified. In other words, in the embodiments described herein, the defects are detected by a hot scan of the wafer to thereby generate a significant number of nuisance defect and noise examples. The embodiments can then use the statistical distribution of the information to find out where these nuisance defects and/or noise events are coming from. By overlaying the defect information in some way (cell, reticle, field, design pattern, etc.), the structures or areas that produced a significant number of nuisance defects can be identified versus areas or structures that did not. The areas or structures that produced significant numbers of nuisance defects can then be identified as nuisance areas. The remaining areas can be determined to be DOI areas or at least non-nuisance areas.

In one embodiment, identifying the source of the nuisance defects includes identifying portions of the results of the stacking in which the results of the stacking and one or more of patterned features in two or more design layers for the wafer have spatial coincidence by comparing locations of the detected defects in the results of the stacking and locations of the patterned features in the two or more design layers and identifying the source of the nuisance defects as one of the two or more design layers including the one or more patterned features having spatial coincidence with the detected defects in the results of the stacking. In particular, as described herein, a stack may be created to identify defects that have spatial coincidence with each other. In addition, the stack may be used to look for patterned feature(s) that are spatially coincident with a set of spatially coincident defects. If there are patterned features that are spatially coincident with the nuisance defects, those features (and their corresponding design layer(s)) are identified as the nuisance defect source. In one such example, the shortest distance between the defect/nuisance/noise events and the closest polygon may be determined, and the layer to which this polygon belongs may be reported as the source of the defect/nuisance/noise events. If one does this for a variety of events, the layer in which the event was introduced can be identified. The shortest distance calculation can be implemented in parallel to the stacking.

Figure 4:
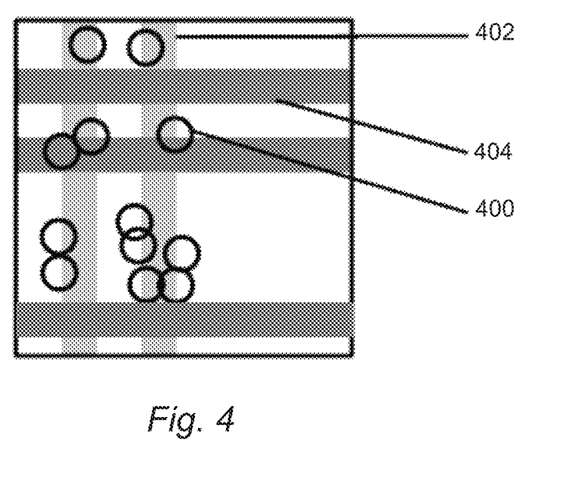
FIGS. 4 and 5 are schematic diagrams illustrating examples of results of stacking information for defects detected on a wafer based on locations determined for the defects relative to a structure on the wafer that may be generated by the embodiments described herein.
Figure 5:
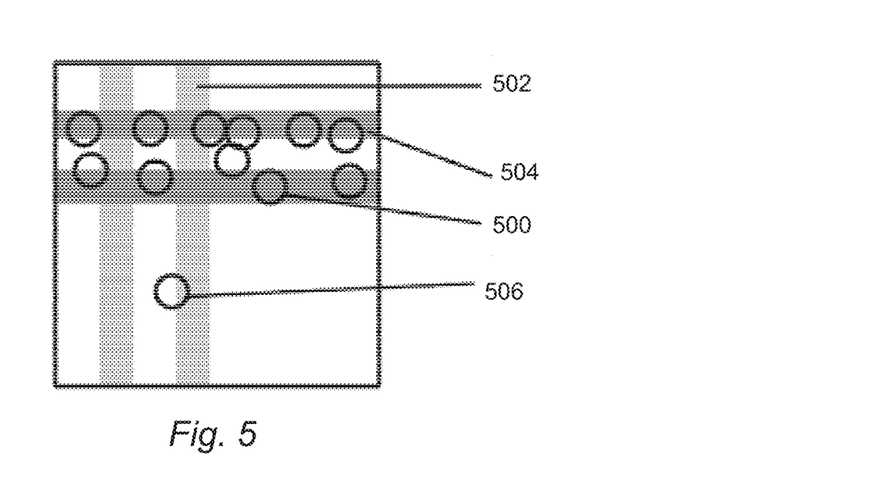

In some embodiments, the source of the nuisance defects includes a design layer of the wafer. In some such examples, FIGS. 4 and 5 illustrate design stack examples for which many nuisance defect examples are projected onto a design clip of the same design based group. Therefore, the design stack examples in FIGS. 4 and 5 may be generated in the stacking step described herein. In these examples, the defect locations are located at the center of the circles shown in FIGS. 4 and 5, and defect location uncertainty error is expressed by the circle radius. In addition, each circle represents a defect. Since there is a location uncertainty (e.g., of several nanometers) no matter how good the embodiments described herein work, the circles are used to mean that the defect is occurring within the circle with 3 sigma probability.

In the example shown in FIG. 4, the nuisance is very likely introduced in layer A originating from line edge roughness of the metal lines. In particular, locations of defects 400 (detected in multiple areas on a wafer corresponding to a design clip) are shown overlaid on the design clip that includes metal lines 402 in layer A and metal lines 404 in layer B. As can then be seen in FIG. 4, the defect locations have spatial coincidence with the edges of metal lines 402 in layer A. As such, the nuisance defects are very likely introduced in layer A due to line edge roughness of the metal lines in layer A. Therefore, the source of the nuisance defects may be identified by the embodiments described herein as layer A. In other words, the identifying step described herein may analyze the results of the stacking shown in FIG. 4 to identify the spatial coincidence between the detected defects and the edges of the metal lines in layer A. Due to that spatial coincidence, the source of the nuisance defects may be identified as the edges of the metal lines in layer A, which most likely cause nuisance defects to be detected due to roughness on the edges.

In the example shown in FIG. 5, the nuisance defects are mostly occurring close or between the metal lines of layer B. CD variation in the metal lines in layer B could cause these nuisance defects to be detected. In particular, locations of defects 500 (detected in multiple areas on a wafer corresponding to a design clip) are overlaid on the design clip that includes metal lines 502 in layer A and metal lines 504 in layer B. As can then be seen in FIG. 5, the defect locations have spatial coincidence with the nearest most edges of two metal lines 504 (i.e., the edges of metal lines 504 facing each other). Therefore, the nuisance defects are mostly occurring close to the nearest most edges of the metal lines of layer B or between the metal lines of layer B. As such, the nuisance defects are very likely introduced in layer B due to CD variations in the metal lines of layer B. The source of the nuisance defects may therefore be identified by the embodiments described herein as layer B. In other words, the identifying step described herein may analyze the results of the stacking shown in FIG. 5 thereby identifying the spatial coincidence between the detected defects and the edges of the metal lines facing each other in layer B and the space between the metal lines in layer B. Due to that spatial coincidence, the source of the nuisance defects may be identified as the edges of the metal lines in layer B, which most likely cause nuisance defects to be detected due to CD variation in the metal lines. As further shown in FIG. 5, outlier 506 may be identified in the design stack results. The outlier can be eliminated if other defect locations are statistically dominating.

FIGS. 4 and 5 are not shown herein to illustrate any particular defect locations or any particular design patterns. Instead, FIGS. 4 and 5 are included herein simply to further understanding of the embodiments described herein.

In another embodiment, identifying the source of the nuisance defects includes determining if the nuisance defects are caused by an uppermost layer on the wafer or a layer underlying the uppermost layer on the wafer. For example, the embodiments described herein advantageously can identify a source of nuisance defects when it is a previous layer on the wafer. While DOI are usually only occurring in the top most layer (the uppermost layer which got printed on the wafer), the nuisance defects can also occur in layers that are below the top layer. In this manner, if one wants to identify which of the layers on the wafer is the source of the nuisance defects, one needs to have the design of the previous layers for use in the stacking step described herein. This way, one can find out in which layer the nuisance defects got introduced. For example, as shown in FIGS. 4 and 5, the metal lines on two different layers (layers A and B) may be shown in the stacking results. Layers A and B may be formed on the wafer in different process steps such that one layer is below the other. In other words, layer A may be the uppermost layer and layer B may be a layer underlying layer A (or vice versa). In addition, the design information for more than two layers on the wafer may be shown in the stacking results generated as described herein. In this manner, the identifying step may look for spatial coincidence between the detected defects and the patterned features in more than one layer on the wafer, which may include an uppermost layer on the wafer and one or more layers underlying that layer. As such, the source of the nuisance defects may be identified as the uppermost layer or one of the underlying layers that includes patterned features having spatial coincidence with the detected defects.

In some embodiments, the nuisance defects include nuisance defects that are not visible to an electron beam based tool. For example, the embodiments described herein can be used to identify a source of nuisance defects when they are not visible to a scanning electron microscope (SEM) review tool in the current layer. In particular, in general, a SEM is not able to detect defects that are below the uppermost surface of the wafer due to the nature of the SEM itself (the electrons either do not penetrate the uppermost surface or are not returned from under the uppermost surface in a manner that renders them detectable). As such, a SEM is not able to detect and analyze nuisance defects that are below the uppermost surface on the wafer. In contrast, some optical inspection systems are able to detect defects below the uppermost surface of the wafer. Such defect detection may be advantageous or disadvantageous depending on the goals of inspection. In some cases, the detection of defects below the uppermost surface of the wafer may be unavoidable even when it is not desired. However, such defects may essentially be nuisance defects in that the user does not care about them and/or they are not DOI for the inspection in which they are detected. Since the embodiments described herein can analyze the defect detection results for spatial coincidence with multiple layers of a wafer, the embodiments described herein can identify sources of nuisance defects (and other defects) even if the defects are not on the uppermost layer of the wafer and therefore are not visible to a SEM.

In a further embodiment, the source of the nuisance defects includes one or more patterned features on the wafer. For example, as described above with respect to the example shown in FIG. 4, the defect locations in the design stack are determined to have spatial coincidence with metal lines 402 of layer A. Therefore, the source of the nuisance defects may be identified as metal lines 402 and in particular the line edge roughness of these metal lines (since the defect locations have spatial coincidence with the edges of metal lines 402 as shown in FIG. 4). In another example, as described above with respect to the example shown in FIG. 5, the defect locations in the design stack are determined to have spatial coincidence with metal lines 504 of layer B. Therefore, the source of the nuisance defects may be identified as metal lines 504 and in particular the CD variation of these metal lines (since the defect locations have spatial coincidence with the edges of these lines that face one another as shown in FIG. 5).

In an additional embodiment, the one or more computer subsystems are configured for detecting other defects on the wafer by applying a defect detection threshold to the output such that at least a majority of the other defects do not include nuisance defects and noise, determining locations of the detected other defects with respect to the design information for the wafer, stacking information for the other defects based on the determined locations relative to a structure on the wafer such that the other defects having the same locations relative to the structure are coincident with each other in results of stacking the information for the other defects, and identifying a source of the other defects based on the results of stacking the information for the other defects. For example, the other defects may be detected by applying a non-hot threshold to the output generated by the detector. In this manner, the other defects may be detected in a non-hot scan or a normal or production type scan. As such, a majority (a substantial portion or almost all) of the other detected defects may be non-nuisance defects or not noise. In other words, a substantial portion of the other detected defects may be DOI. The other defects may otherwise be detected as described herein. The locations of the other defects may be determined as described herein. The information for the other defects may be stacked as described herein, and the source of the other defects may be identified as described herein. In addition, as described above, determining the locations of the defects may include design based alignment. Therefore, the embodiments described herein may be configured for defect source analysis using design based alignment. In particular, the projection techniques described herein are not limited to finding out the source of nuisance defects but can also be used to project the locations of DOIs substantially accurately into a reticle, die, or design pattern stack to identify at which layer and what design structure the DOI got introduced.

In another embodiment, the one or more computer subsystems are configured for verifying identification of the nuisance defects in the detected defects by selecting a portion of the nuisance defects for defect review and performing the defect review for the selected portion of the nuisance defects. For example, the computer subsystem(s) may be configured for SEM reviewing some defects to determine if they are indeed nuisance defects. The portion of the nuisance defects may be selected in any suitable manner (e.g., random sampling, diversity sampling, etc.). The number of the nuisance defects in the selected portion may be any suitable number. Performing the defect review may include acquiring defect review images for the defects in the selected portion. The defect review images may be acquired using a defect review system such as that described above with respect to FIG. 2. However, the defect review images may be acquired from a storage medium in which the images generated by a defect review system such as that described above with respect to FIG. 2 have been stored. The storage medium may include any of the computer-readable storage media described herein. Performing the defect review may also include analyzing the images in some manner (e.g., measuring the dimensions of the patterned structures or defects shown in the images) such that the detected defects can be classified (e.g., as line edge roughness nuisance defects, as CD variation nuisance defects, as color variation nuisance defects, as actual defects or DOIs, etc.).

In this manner, if there are wafers for which it is not obvious how to set the threshold using defect density data, a defect review, e.g., with a SEM or the optical patch images coming from the tool, can be performed to classify some of the defects or patch images. After this classification, it will be more clear which structures in the stack contain or are near nuisance defects.

In an embodiment, the one or more computer subsystems are configured for generating an inspection recipe for the wafer based on information for the source of the nuisance defects such that the nuisance defects are not detected in the inspection recipe. A "recipe" as that term is used herein can be generally defined as a set of instructions that can be used by a tool to perform a process on a wafer. In this manner, generating a recipe may include generating information for how a process is to be performed, which can then be used to generate the instructions for performing that process.

In one such embodiment, the inspection recipe may be configured such that nuisance areas or structures are ignored in actual inspections, which allows more sensitive inspections to be performed thereby allowing detection of more DOIs. For example, design based analysis can help to eliminate all of the structures in the stack that contain (or are near) nuisance defects from being inspected in the inspection process by creating "do not inspect care areas" that correspond to those structures. In another example, a threshold used in defect detection performed by the inspection recipe may be set lower in areas where defects are expected or known to be and higher in nuisance areas. For example, if it is known that nuisance defects occur at or near a particular patterned feature, the threshold(s) used for defect detection at or near that particular patterned feature can be set relatively high (to ensure detection of as few nuisance defects as possible) compared to threshold(s) used for inspection in other areas of the wafer. Therefore, the inspection recipe may be set up so that areas or patterned features that have been identified as a source of nuisance defects can be inspected much colder than other areas of the wafer. In an additional example, the inspection recipe may be generated to include information for care areas (areas in which the inspection is to be performed) that exclude the nuisance areas or structures identified as described herein. In this manner, the embodiments described herein may be used to identify the source of nuisance defects and also to reduce the detection of nuisance defects on the wafer or other wafers if so desired.

The embodiments described herein have a number of advantages over other methods and systems for defect source analysis. For example, the embodiments described herein identify the source of nuisance and defect events much faster than previously used techniques. In addition, the embodiments described herein can identify a source when it is in a previous layer and not visible to a SEM review tool in the current layer. Furthermore, using the embodiments described herein during inspection will improve the sensitivity to key DOI by identifying and reducing the number of nuisance defects. Finding key DOI can save users of inspection tools millions of dollars.

The embodiments also have a number of important differences from previously used inspection methods and systems. For example, some currently used inspection methods and systems use design information with detected defect information to perform design based grouping (DBG) or design based classification (DBC). In such methods and systems, however, the defect locations are not interpolated as described herein but use a much bigger design window as a pattern of interest. A design window contains many polygons which belong to different layers. If we only know that the defect is within the design window (same design group), one cannot conclude from which structure it is coming and at which layer it got introduced. In addition, unlike many DBG and DBC methods and systems, the embodiments described herein are configured to perform defect source analysis, meaning they find out in which layer the DOI or nuisance defects got introduced. Most importantly, the embodiments described herein are configured to analyze nuisance defects and/or noise events. This concept is not believed to be part of DBG and DBC methods and systems. In practice, it is substantially difficult to find out the source of nuisance defects and/or noise events (where the nuisance events are coming from (layer and exact pattern)) based on SEM images but the understanding is crucial to find the right inspection strategy.

Each of the embodiments of the system may be further configured according to any other embodiment(s) described herein.

Another embodiment relates to a computer-implemented method for identifying a source of nuisance defects on a wafer. The method includes steps for each of the functions of the computer subsystem(s) described above. The inspection subsystem is configured as described herein.

Each of the steps of the method may be performed as described further herein. The method may also include any other step(s) that can be performed by the inspection subsystem, computer subsystem(s), and/or system(s) described herein. The steps of the method are performed by one or more computer subsystems, which may be configured according to any of the embodiments described herein. In addition, the method described above may be performed by any of the system embodiments described herein.

Figure 6:
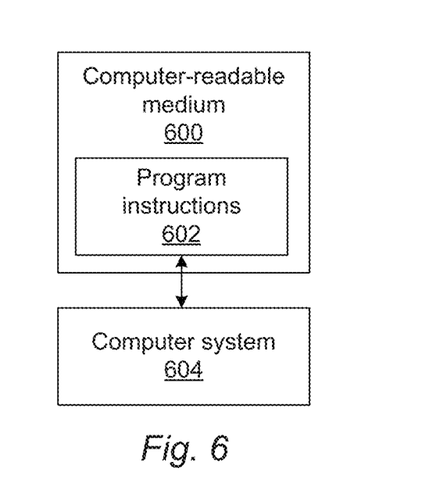
FIG. 6 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for identifying a source of nuisance defects on a wafer. One such embodiment is shown in FIG. 6. In particular, as shown in FIG. 6, non-transitory computer-readable medium 600 includes program instructions 602 executable on computer system 604. The computer-implemented method may include any step(s) of any method(s) described herein.

Program instructions 602 implementing methods such as those described herein may be stored on computer-readable medium 600. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 604 may be configured according to any of the embodiments described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, the embodiments described herein may generate an inspection recipe as described above. That inspection recipe may then be stored and used by the system or method (or another system or method) to perform inspection on the wafer or other wafers to thereby detect defects on the wafer or other wafers.

Further modifications and alternative embodiments of various aspects of the invention will be apparent to those skilled in the art in view of this description. For example, methods and systems for identifying a source of nuisance defects on a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to identify a source of nuisance defects on a wafer, comprising:
   an inspection subsystem comprising at least an energy source and a detector, wherein the energy source is configured to generate energy that is directed to a wafer, and wherein the detector is configured to detect energy from the wafer and to generate output responsive to the detected energy; and
   one or more computer subsystems configured for:
      detecting defects on the wafer by applying a hot threshold to the output such that at least a majority of the detected defects comprise nuisance defects;
      determining locations of the detected defects with respect to design information for the wafer;
      stacking information for the detected defects based on the determined locations relative to a structure on the wafer such that the detected defects having the same locations relative to the structure are coincident with each other in results of the stacking; and
      identifying a source of the nuisance defects based on the results of the stacking.

2. The system of claim 1, wherein the locations of the detected defects are determined with sub-pixel accuracy.

3. The system of claim 1, wherein the locations of the detected defects are determined by interpolation of the defect locations within the output and alignment of the output to the design information for the wafer.

4. The system of claim 1, wherein detecting the defects comprises generating difference images for different portions of the output by subtracting reference output for the different portions from the different portions of the output and applying the hot threshold to the difference images, and wherein determining the locations of the detected defects is performed by fitting a portion of the difference images corresponding to the detected defects to a function.

5. The system of claim 1, wherein the one or more computer subsystems are further configured for identifying the detected defects that are the nuisance defects by identifying areas in the stacking results in which a number of the detected defects located therein per unit area is greater than a predetermined threshold and designating the detected defects located in the identified areas as the nuisance defects.

6. The system of claim 1, wherein the structure on the wafer comprises a die on the wafer.

7. The system of claim 1, wherein the structure on the wafer comprises a printed instance of a reticle on the wafer.

8. The system of claim 1, wherein the structure on the wafer comprises patterned features formed on the wafer.

9. The system of claim 1, wherein identifying the source of the nuisance defects comprises identifying portions of the results of the stacking in which the results of the stacking and one or more of patterned features in two or more design layers for the wafer have spatial coincidence by comparing locations of the detected defects in the results of the stacking and locations of the patterned features in the two or more design layers and identifying the source of the nuisance defects as one of the two or more design layers comprising the one or more patterned features having spatial coincidence with the detected defects in the results of the stacking.

10. The system of claim 1, wherein the source of the nuisance defects comprises a design layer of the wafer.

11. The system of claim 1, wherein identifying the source of the nuisance defects comprises determining if the nuisance defects are caused by an uppermost layer on the wafer or a layer underlying the uppermost layer on the wafer.

12. The system of claim 1, wherein the nuisance defects comprise nuisance defects that are not visible to an electron beam based tool.

13. The system of claim 1, wherein the source of the nuisance defects comprises one or more patterned features on the wafer.

14. The system of claim 1, wherein the one or more computer subsystems are further configured for detecting other defects on the wafer by applying a defect detection threshold to the output such that at least a majority of the other defects do not comprise nuisance defects and noise, determining locations of the detected other defects with respect to the design information for the wafer, stacking information for the other defects based on the determined locations relative to a structure on the wafer such that the other defects having the same locations relative to the structure are coincident with each other in results of stacking the information for the other defects, and identifying a source of the other defects based on the results of stacking the information for the other defects.

15. The system of claim 1, wherein the one or more computer subsystems are further configured for verifying identification of the nuisance defects in the detected defects by selecting a portion of the nuisance defects for defect review and performing the defect review for the selected portion of the nuisance defects.

16. The system of claim 1, wherein the one or more computer subsystems are further configured for generating an inspection recipe for the wafer based on information for the source of the nuisance defects such that the nuisance defects are not detected in the inspection recipe.

17. The system of claim 1, wherein the inspection subsystem is configured as an optical inspection subsystem.

18. A non-transitory computer-readable medium, storing program instructions executable on a computer system for performing a computer-implemented method for identifying a source of nuisance defects on a wafer, wherein the computer-implemented method comprises:

detecting defects on the wafer by applying a hot threshold to output generated for the wafer by a detector of an inspection subsystem such that at least a majority of the detected defects comprise nuisance defects, wherein the inspection subsystem comprises at least an energy source and the detector, wherein the energy source is configured to generate energy that is directed to the wafer, and wherein the detector is configured to detect energy from the wafer and to generate the output responsive to the detected energy;

determining locations of the detected defects with respect to design information for the wafer;

stacking information for the detected defects based on the determined locations relative to a structure on the wafer such that the detected defects having the same locations relative to the structure are coincident with each other in results of the stacking; and identifying a source of the nuisance defects based on the results of the stacking.

19. A computer-implemented method for identifying a source of nuisance defects on a wafer, comprising:

detecting defects on the wafer by applying a hot threshold to output generated for the wafer by a detector of an inspection subsystem such that at least a majority of the detected defects comprise nuisance defects, wherein the inspection subsystem comprises at least an energy source and the detector, wherein the energy source is configured to generate energy that is directed to the wafer, and wherein the detector is configured to detect energy from the wafer and to generate the output responsive to the detected energy;

determining locations of the detected defects with respect to design information for the wafer;

stacking information for the detected defects based on the determined locations relative to a structure on the wafer such that the detected defects having the same locations relative to the structure are coincident with each other in results of the stacking; and identifying a source of the nuisance defects based on the results of the stacking, wherein said detecting, determining, stacking, and identifying are performed by one or more computer subsystems coupled to the inspection subsystem.

* * * * *